(12) United States Patent
Chen et al.

(10) Patent No.: US 12,467,463 B2
(45) Date of Patent: Nov. 11, 2025

(54) POWER SUPPLY UNIT WITH CONSOLIDATED DIFFERENT AIRFLOW DIRECTION FANS

(71) Applicant: DELL PRODUCTS L.P., Round Rock, TX (US)

(72) Inventors: Yu-Lin Chen, Taipei (TW); Chun-Cheng Lin, New Taipei (TW); Yueh-Chun Tsai, Taoyuan (TW); Po Hsiang Liao, Taoyuan District (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/629,398

(22) Filed: Apr. 8, 2024

(65) Prior Publication Data

US 2025/0314254 A1    Oct. 9, 2025

(51) Int. Cl.
*F04D 19/00* (2006.01)
*F04D 29/58* (2006.01)
*H05K 7/20* (2006.01)

(52) U.S. Cl.
CPC .......... *F04D 19/005* (2013.01); *F04D 29/582* (2013.01); *H05K 7/20145* (2013.01)

(58) Field of Classification Search
CPC .............. F04D 19/005; H05K 7/20727; H05K 7/20172; H05K 7/20145; H05K 5/0217; H05K 5/03
See application file for complete search history.

(56) References Cited

U.S. PATENT DOCUMENTS

| | | | |
|---|---|---|---|
| 6,031,717 A | 2/2000 | Baddour et al. | |
| 6,351,380 B1 * | 2/2002 | Curlee | H05K 7/20172 361/695 |
| 7,542,272 B2 | 6/2009 | Pike et al. | |
| 8,320,120 B1 * | 11/2012 | Chan | H05K 7/20727 165/122 |
| 9,999,161 B2 * | 6/2018 | Mease | H05K 7/20727 |
| 2012/0140406 A1 * | 6/2012 | Kliewer | G06F 1/20 361/679.48 |

* cited by examiner

*Primary Examiner* — Nathaniel E Wiehe
*Assistant Examiner* — Maxime M Adjagbe
(74) *Attorney, Agent, or Firm* — Larson Newman, LLP

(57) ABSTRACT

A power supply unit includes a main portion and a dual direction cooling fan. The main portion includes a cooling fan slot. The dual direction cooling fan inserted within cooling fan slot of the main portion. The dual direction cooling fan includes first, second, third, and fourth panels. The first panel is positioned toward a middle line of the main portion and the second positioned toward an outside edge of the main portion when the dual direction cooling fan is inserted within the cooling fan slot. The third panel is positioned toward a top panel of the main portion when the dual direction cooling fan is in a reverse airflow orientation. The fourth panel is positioned toward the top panel of the main portion when the dual direction cooling fan is in a normal airflow orientation.

17 Claims, 11 Drawing Sheets

POWER SUPPLY UNIT WITH CONSOLIDATED DIFFERENT AIRFLOW DIRECTION FANS

FIELD OF THE DISCLOSURE

The present disclosure generally relates to information handling systems, and more particularly relates to a power supply unit with consolidated different airflow direction fans.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A power supply unit includes a main portion and a dual direction cooling fan. The main portion includes a cooling fan slot. The dual direction cooling fan may be inserted within cooling fan slot of the main portion. The dual direction cooling fan includes first, second, third, and fourth panels. The first panel may be positioned toward a middle line of the main portion and the second positioned toward an outside edge of the main portion when the dual direction cooling fan is inserted within the cooling fan slot. The third panel may be positioned toward a top panel of the main portion when the dual direction cooling fan is in a reverse airflow orientation. The fourth panel may be positioned toward the top panel of the main portion when the dual direction cooling fan is in a normal airflow orientation.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
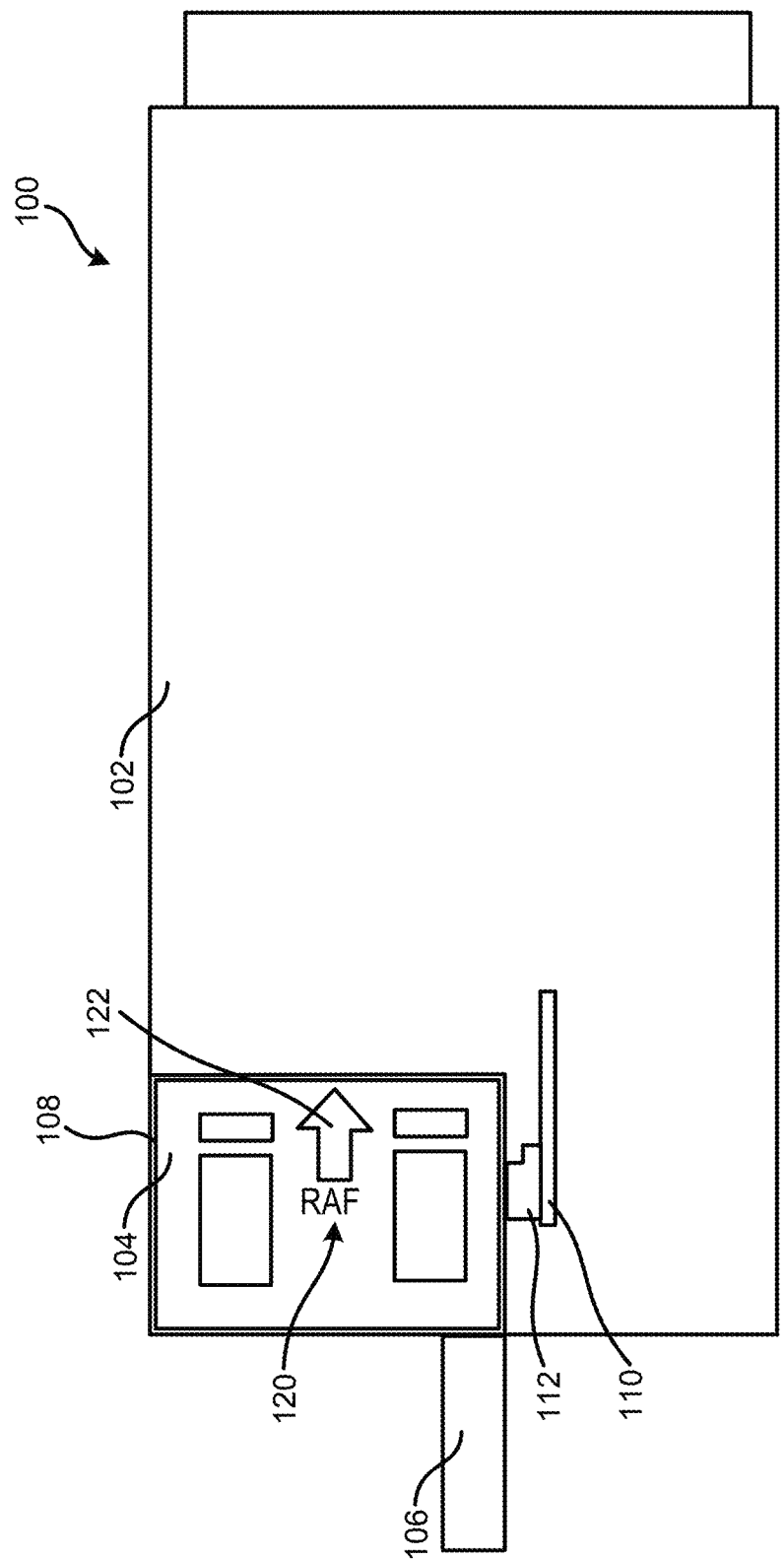
FIGS. 1 and 2 block diagrams of a power supply unit including a dual-direction cooling fan according to at least one embodiment of the present disclosure.
Figure 2:
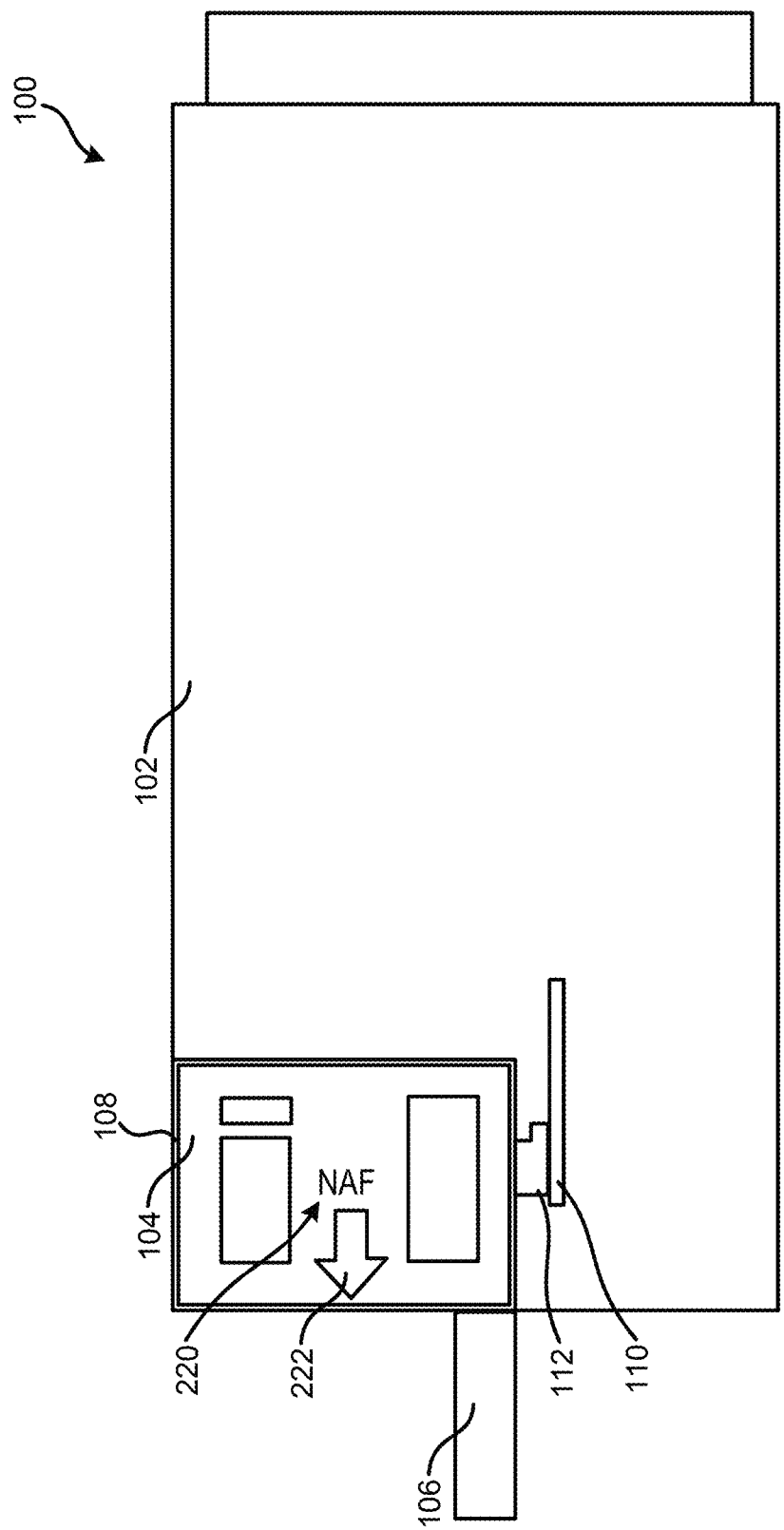
Figure 13:
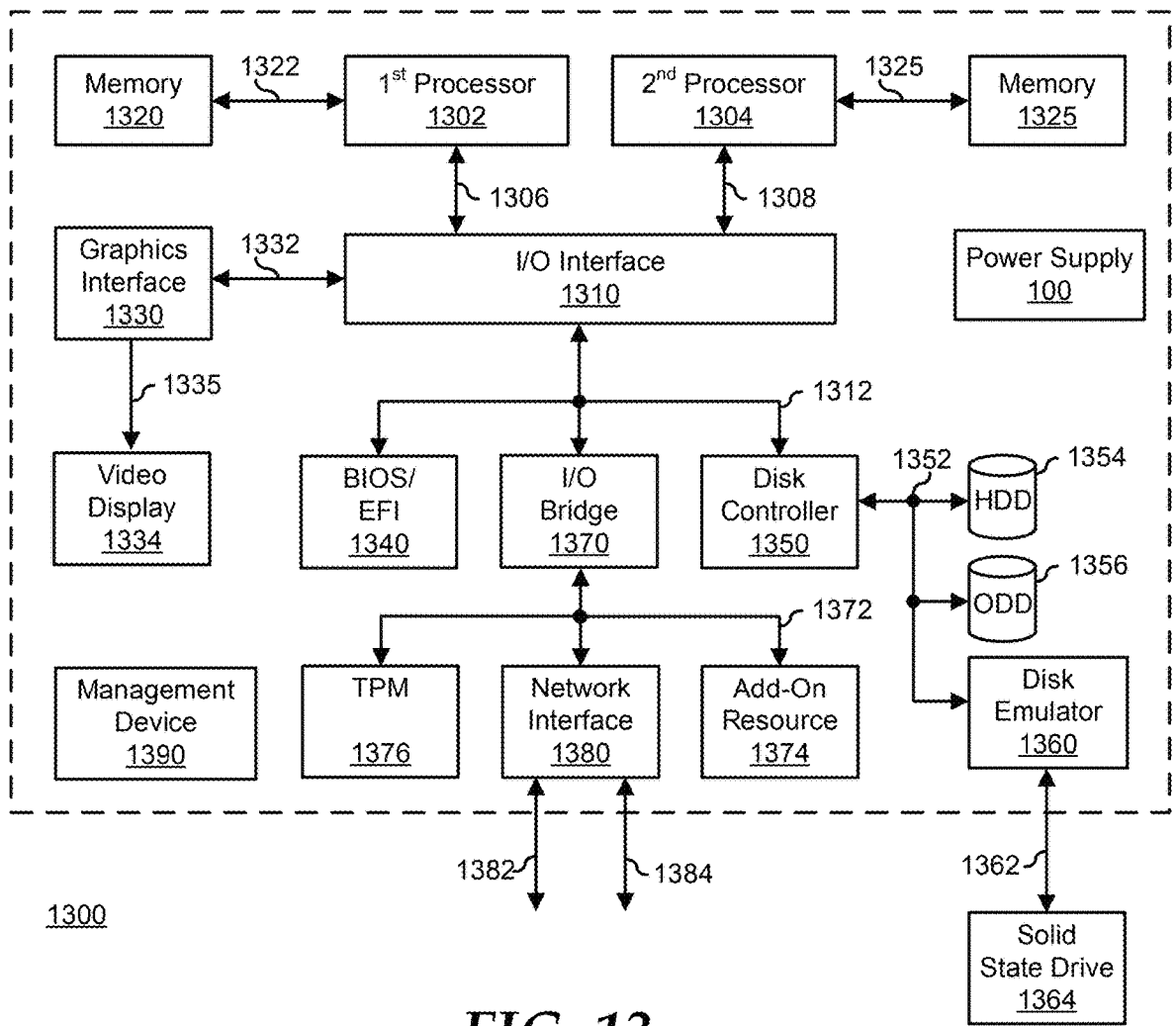
FIG. 13 is a block diagram of a general information handling system according to an embodiment of the present disclosure.

FIGS. 1 and 2 illustrate a power supply unit 100 for an information handling system, such as information handling system 1300 of FIG. 13, according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Power supply unit 100 includes a main portion 102, a dual direction cooling fan 104, and a handle 106. Main portion 102 includes a cooling fan slot 108 to receive dual direction cooling fan 104. Within main portion 102, power supply unit includes a power board 110 and a connector 112. Power board 110 may be electrically coupled to dual direction cooling fan 104 via a physical communication between connector 112 and pins of the cooling fan. Dual direction cooling fan 104 includes airflow direction indicators 120 and 220 and airflow direction arrows 122 and 222. For clarity and brevity, dual direction cooling fan 104 may be referred to herein as both dual direction cooling fan and cooling fan. Power supply unit 100 may include additional components without varying from the scope of this disclosure.

In certain examples, power supply unit 100 may be inserted within a server rack and may be sized to a 1U height. In an example, the server rack may have a cold aisle on one side of the server rack and a hot aisle on the opposite side. However, the cold aisle may not always be located on the same side of the server rack. In this situation, the cold aisle may be on different sides or ends of power supply unit 100. For example, the cold aisle may be located on the same end of power supply unit 100 as dual direction cooling fan 104, or the cold aisle may be located on the opposite end of the power supply unit as the dual direction cooling fan. In an example, the airflow through power supply unit 100 should be from the cold aisle to the hot aisle.

In an example, dual direction cooling fan 104 may be inserted within slot 108 of power supply unit 100 in two orientations. For example, cooling fan 104 may be inserted in reversed airflow (RAF) orientation or a normal airflow (NAF) orientation. Depending on the orientation of dual direction cooling fan 104, the cooling fan may either push airflow through power supply unit 100 or pull airflow through the power supply unit. In an example, dual direction cooling fan 104 may be switched between the RAF orientation and the NAF orientation by a one-hundred-and-eighty-degree rotation of the dual direction cooling fan as will be described with respect to FIGS. 3 and 4 below.

In certain examples, airflow direction indicators 120 and 220 and airflow direction arrows 122 and 222 may indicate the orientation of cooling fan 104. For example, airflow direction indicator 120 may include the letters 'RAF' to represent that cooling fan 104 is in the reverse airflow direction as shown in FIG. 1. Additionally, airflow direction arrow 122 may point from an outer side of power supply unit 100 to the middle of the power supply unit as shown in FIG. 1.

In certain examples, the orientation of dual direction cooling fan 104 may be set based on the location of the cold aisle with respect to the location of the cooling fan. For example, if the cold aisle is on the edge or end nearest cooling fan 104 and handle 106, the cooling fan may be inserted within slot 108 of power supply unit in the 'RAF' orientation as shown by airflow direction indicator 120. In the 'RAF' orientation, the airflow may move from the outer edge of power supply unit 100 nearest to cooling fan 104 toward the opposite edge of the power supply unit as shown by airflow direction arrow 122. In the RAF orientation, dual direction cooling fan 104 may push the airflow through power supply unit 100.

Referring now to FIG. 2, airflow direction indicator 220 may include the letters 'NAF' to represent that cooling fan 104 is in the normal airflow direction. Also, airflow direction arrow 222 may point from the middle of power supply unit 100 to an outer side of the power supply unit. If the cold aisle is on the edge or end farthest from cooling fan 104 and handle 106, the cooling fan may be inserted within slot 108 of power supply unit in the 'NAF' orientation as shown by airflow direction indicator 220. In the 'NAF' orientation, the airflow may move from the outer edge of power supply unit 100 farthest from cooling fan 104 toward the edge of the power supply unit nearest to the cooling fan as shown by airflow direction arrow 222. In the NAF orientation, dual direction cooling fan 104 may pull the airflow through power supply unit 100.

Figure 3:
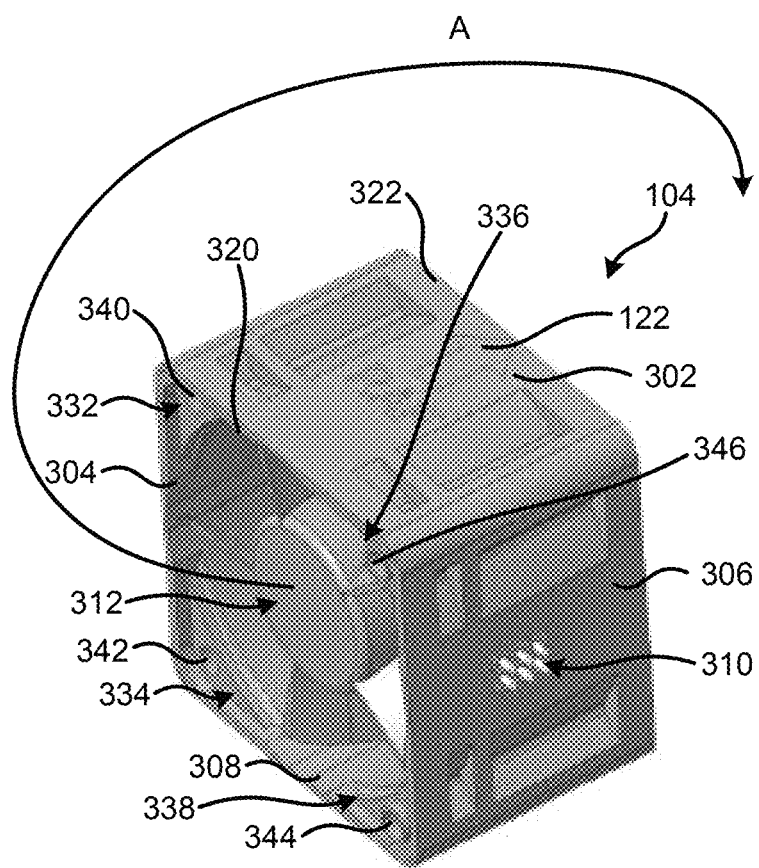
FIG. 3 is a perspective view of a dual direction cooling fan in reverse airflow orientation according to at least one embodiment of the present disclosure.

FIG. 3 illustrates dual direction cooling fan 104 in the RAF orientation according to at least one embodiment of the present disclosure. Cooling fan 104 includes panels 302, 304, 306, and 308, connector pins 310, and a fan 314. In an example, connector pins 310 are mounting on panel 306. Cooling fan 104 also includes surfaces 320 and 322. Surface 320 extends along similar edges of panels 302, 304, 306, and 308, and surface 320 extends along distal edges of panels 302, 304, 306, and 308 as compared to surface 320. Cooling fan 104 includes support areas 332, 334, 336, and 338, and screw holes 340, 342, 344, and 346. Cooling fan 104 may include additional components without varying from the scope of this disclosure.

In an example, support area 332 is located at the intersection or corner of panel 302 and panel 304 and support area 332 is located at the intersection or corner of panel 304 and panel 308. Similarly, support area 336 is located at the intersection or corner of panel 302 and panel 306 and support area 338 is located at the intersection or corner of panel 306 and panel 308. In certain examples, support area 332 may be located within cooling fan 104, such that a portion of panel 302 extends between support area 332 and surface 320 and a portion of panel 304 extends between support area 332 and surface 320. Similarly, support area 334 may be located within cooling fan 104, such that a portion of panel 308 extends between support area 334 and surface 320 and a portion of panel 304 extends between support area 334 and surface 320. Support area 336 may be located within cooling fan 104, such that a portion of panel 308 extends between support area 336 and surface 320 and a portion of panel 306 extends between support area 336 and surface 320. Similarly, support area 338 may be located within cooling fan 104, such that a portion of panel 302 extends between support area 338 and surface 320 and a portion of panel 306 extends between support area 338 and surface 320.

In certain examples, the opening of screw hole 340 may be substantially flush with support area 332, and the opening of screw hole 342 may be substantially flush with support area 334. In an example, the opening of screw hole 344 may be substantially flush with surface 320, and the opening of screw hole 346 may be substantially flush with surface 320. In this example, the opening of screw hole 344 may be located above a surface of support area 336, and the opening of screw hole 346 may be located above a surface of support area 338.

In an example, while cooling fan 104 is in the RAF orientation, fan 312 may pull an airflow from outside a power supply unit, such as power supply unit 100, and through the power supply unit in the direction of airflow arrow 122. Cooling fan 104 may be switched from the RAF orientation to the NAF orientation by the cooling fan being rotated one-hundred and eighty degrees in the direction of arrow A. In response to cooling fan 104 being rotated in the direction of arrow A, connector pins 310 on panel 306 may still be facing substantially the same direction as shown in FIG. 4.

Figure 4:
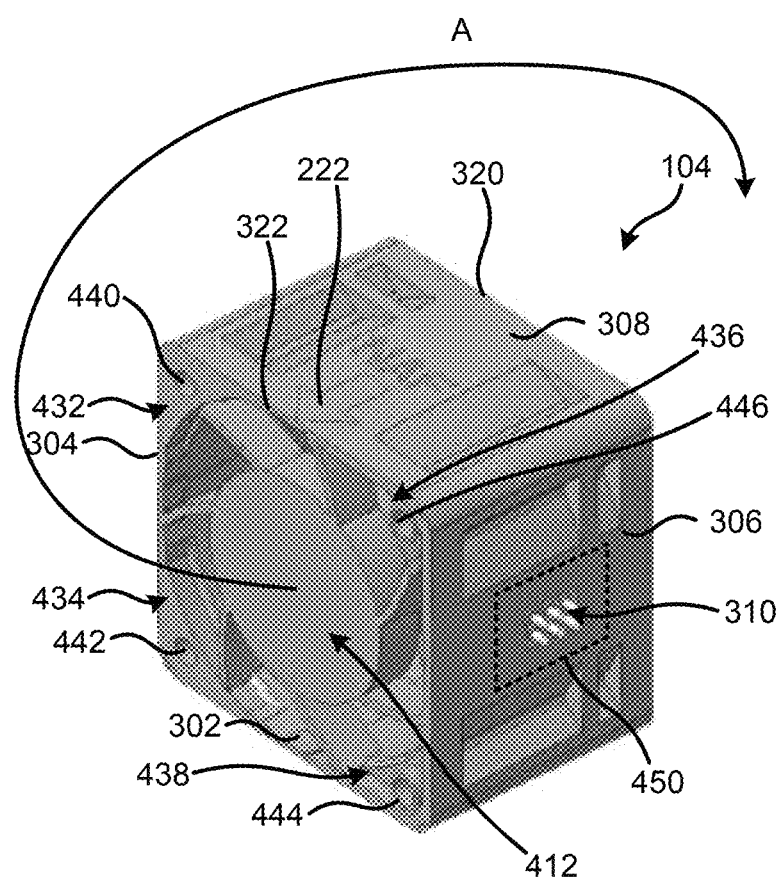
FIG. 4 is a perspective view of a dual direction cooling fan in a normal airflow orientation according to at least one embodiment of the present disclosure.

FIG. 4 illustrates dual direction cooling fan 104 in the NAF orientation according to at least one embodiment of the present disclosure. Cooling fan 104 includes a fan cover 412. Cooling fan 104 also includes support areas 432, 434, 436, and 438, and screw holes 440, 442, 444, and 446. Cooling fan 104 may include additional components without varying from the scope of this disclosure.

In an example, support area 432 is located at the intersection or corner of panel 308 and panel 304 and support area 432 is located at the intersection or corner of panel 304 and panel 302. Similarly, support area 436 is located at the intersection or corner of panel 302 and panel 306 and support area 438 is located at the intersection or corner of panel 306 and panel 308. In certain examples, support areas 432 and 434 may both be substantially flush with surface 322. Support area 436 may be located within cooling fan 104, such that a portion of panel 302 extends between support area 436 and surface 322 and a portion of panel 306 extends between support area 436 and surface 320. Similarly, support area 438 may be located within cooling fan 104, such that a portion of panel 308 extends between support area 438 and surface 322 and a portion of panel 306 extends between support area 438 and surface 322.

In certain examples, the opening of screw hole 440 may be substantially flush with support area 432, which in turn is substantially flush with surface 322. Similarly, the opening of screw hole 442 may be substantially flush with support area 434, which in turn is substantially flush with surface 322. In an example, the opening of screw hole 444 may be substantially flush with surface 320, and the opening of screw hole 446 may be substantially flush with surface 320. In this example, the opening of screw hole 444 may be located above a surface of support area 436, and the opening of screw hole 446 may be located above a surface of support area 438.

In an example, while cooling fan 104 is in the NAF orientation, fan cover 412 may be located on an outer edge of a power supply unit, such as power supply unit 100 of FIG. 1. While cooling fan 104 is in the NAF orientation, the fan may pull an airflow through power supply unit 100 of FIG. 1, and out of the power supply unit in the direction of airflow arrow 222. Cooling fan 104 may be switched from the NAF orientation to the RAF orientation by the cooling fan being rotated one-hundred and eighty degrees in the direction of arrow A. A portion 450 of panel 306 and connector pins 310 is illustrated in FIG. 5.

Figure 5:
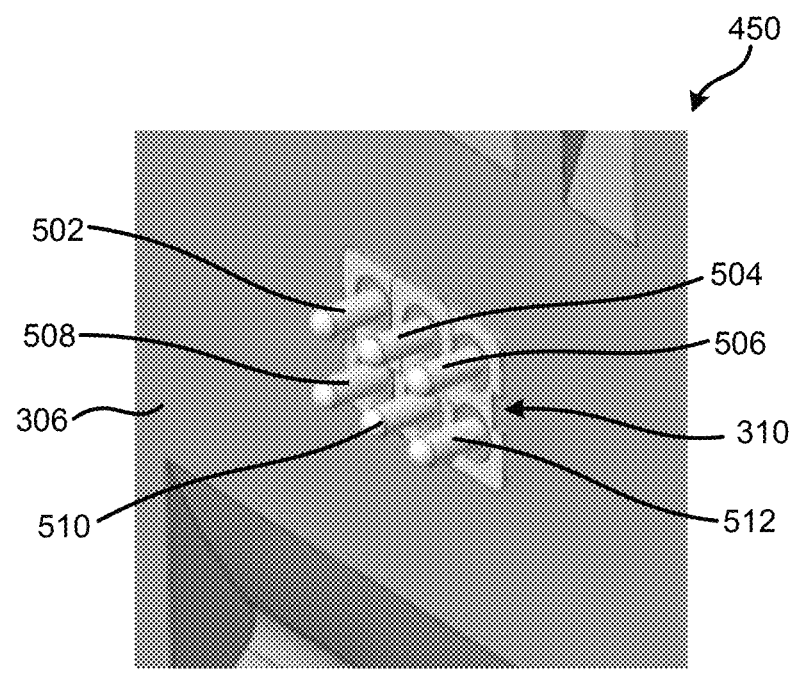
FIG. 5 is a perspective view of a portion of a dual direction cooling with connector pins according to at least one embodiment of the present disclosure.

FIG. 5 illustrates portion 450 including panel 306 and connector pins 310 according to at least one embodiment of the present disclosure. Connector pins 310 include individual pins 502, 504, 506, 508, 510, and 512, and these pins may have a specific pin out configuration. For example, pin 502 may be a negative voltage pin, pin 504 may be a pulse width modulate (PWM) signal pin, pin 506 may be a positive voltage pin, pin 508 may be a positive voltage pin, pin 510 may be a PWM signal pin, and pin 512 may be a negative voltage pin. Based on this exemplary pin out of connector pins 310, the locations of the positive and negative connector pins may be the same when cooling fan 104 is in both the RAF orientation and the NAF orientation. The pin out of connector pins 310 may be the same in both orientations because the cooling fan 104 is rotated one-hundred and eighty degrees between the NAF orientation and the RAF orientation, such that the positive and negative pin locations are the same.

In an example, connector pins 310 may be any suitable type of pins, such as spring-loaded pins. In this example, each of pins 502, 504, 506, 508, 510, and 512 may include a mechanism to bias each of the pins in an extended position. In response to a force being exerted again the tip of a pin, that pin may slide within panel 306 until the force is removed. In this situation, as each of pins 502, 504, 506, 508, 510, and 512 slide past connector 112 in FIG. 6, the pins may retract until they align with connector holes of the connector. When pins 502, 504, 506, 508, 510, and 512 align with the holes of connector 112 in FIG. 6, the pins may extend into the connector holes to form a connection between the connector and the pins.

Figure 6:
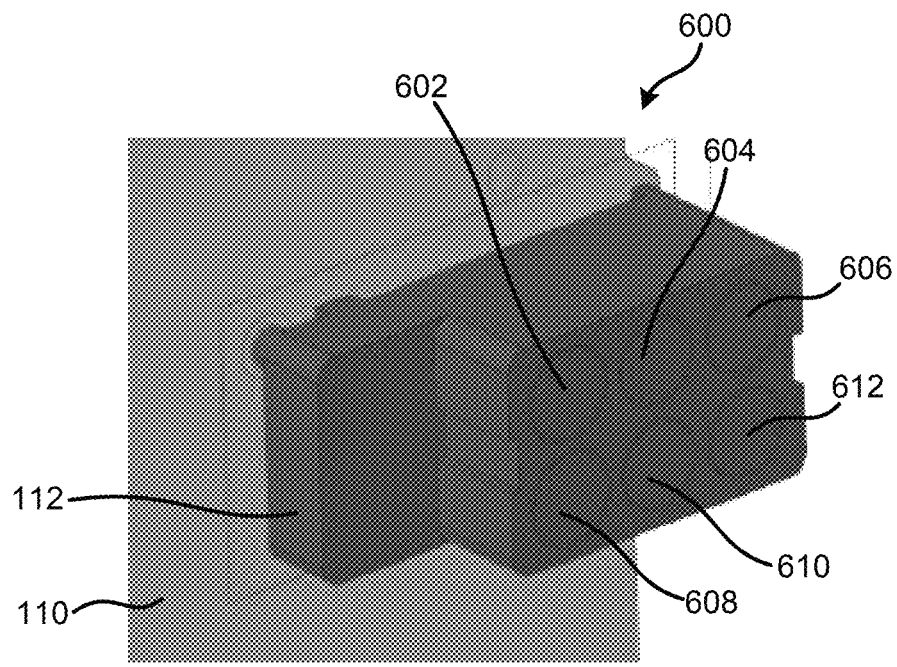
FIG. 6 is a perspective view of a portion of power interface board and a connector according to at least one embodiment of the present disclosure.

FIG. 6 illustrates a portion 600 of power interface board 110 and connector 112 according to at least one embodiment of the present disclosure. Connector 112 is in physical and electrical communication with power interface board 110. For example, connector 112 may provide PWM signals and voltages from power interface board 110 to a cooling fan, such as cooling fan 104 of FIG. 1. Power interface board 110 may be connected to other components of a power supply unit, such as power supply unit 100 of FIG. 1. Power interface board 110 may receive control signals and power from these other components. Based on the received control signals and power, power interface board 110 may provide the PWM signals and power through connector 112.

Connector 112 includes connector holes 602, 604, 606, 608, 610, and 612 that may be utilized to provide an interface between the connector and connector pins 310 of cooling fan 104 in FIG. 3. In an example, connector holes 602, 604, 606, 608, 610, and 612 may have a specific pin out configuration. For example, connector hole 602 may be a positive voltage connection, connector hole 604 may be a PWM signal connection, connector hole 606 may be a negative voltage connection, connector hole 608 may be a negative voltage connection, connector hole 610 may be a PWM signal connection, and connector hole 612 may be a positive voltage connection. Based on this exemplary pin out of connector 112, the connector holes 602, 604, 606, 608, 610, and 612 may align with the proper pins of a cooling fan 104 of FIG. 1 when the cooling fan is in both the RAF orientation and the NAF orientation.

Figure 7:
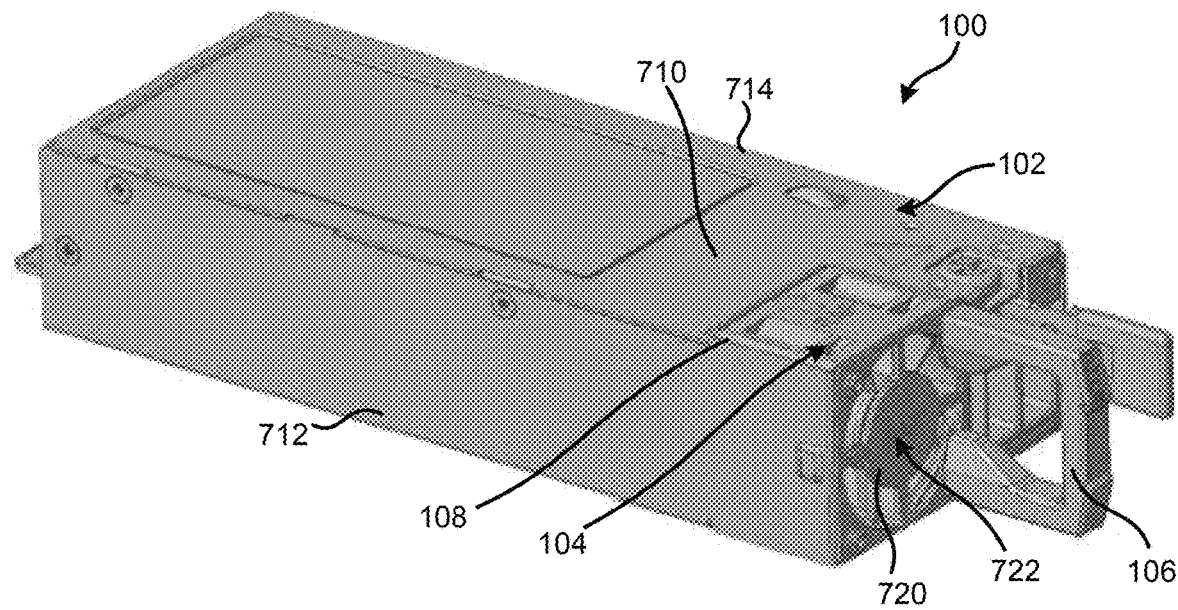
FIGS. 7 and 8 is a perspective views of power supply unit according to at least one embodiment of the present disclosure.
Figure 8:
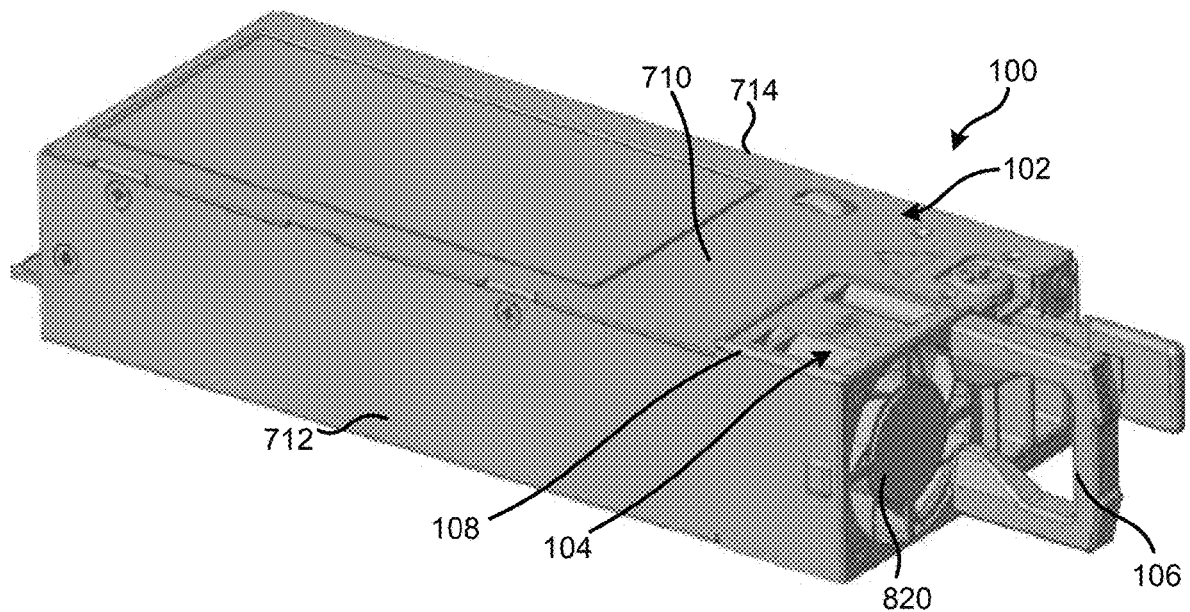

FIGS. 7 and 8 illustrate power supply unit 100 according to at least one embodiment of the present disclosure. Main portion 102 includes panels 710, 712, and 714. Power supply unit 100 further includes a RAF fan cover 720, which in turn includes an airflow direction indicator 722. Power supply unit 100 also includes a NAF fan cover 820 shown in FIG. 8. In an example, airflow direction indicator 722 may indicate that cooling fan 104 is in the RAF orientation. Power supply unit 100 may include additional components without varying from the scope of this disclosure.

In certain examples, cooling fan 104 may include a fan, such as fan 312 in FIG. 3, at one of multiple possible angles. For example, when cooling fan 104 is in the RAF orientation, as illustrated in FIG. 7, the fan may be at ninety degrees, ninety-five degrees, or one hundred degrees. In certain examples, when the fan is at ninety degrees, cooling fan 104 may push the airflow substantially straight through power supply unit 100. When the fan is at one hundred degrees, cooling fan 104 may push the airflow in a diagonal direction from panel 714 to the cooling fan. When the fan is at ninety-five degrees, cooling fan 104 may push the airflow in a slightly less diagonal direction, as compared to one hundred degrees, from panel 714 to the cooling fan. In an example, the different fan degrees within cooling fan 104 may be utilized for different thermal requirements when the cooling fan is in the RAF orientation.

In certain examples, when cooling fan 104 is in the NAF orientation, as illustrated in FIG. 8, the fan may be at ninety degrees, ninety-five degrees, or one hundred degrees. In certain examples, when the fan is at ninety degrees, cooling fan 104 may pull the airflow substantially straight through power supply unit 100. When the fan is at one hundred degrees, cooling fan 104 may pull the airflow in a diagonal direction from panel 714 to the cooling fan. When the fan is at ninety-five degrees, cooling fan 104 may pull the airflow in a slightly less diagonal direction, as compared to one hundred degrees, from panel 714 to the cooling fan. In an example, the different fan degrees within cooling fan 104 may be utilized for different thermal requirements when the cooling fan is in the NAF orientation.

In an example, panel 710 may extend perpendicularly between panels 712 and 714. For example, panel 710 may extend from a first edge of panel 712 to a similarly located edge of panel 714. In certain examples, panel 710 may have a notch, such as cooling fan slot 108, to enable cooling fan 104 to be inserted within power supply unit 100 when panels 710, 712, and 714 are all installed or connected to one another on the power supply unit. In an example, a particular panel, such as panel 306 of FIG. 3, of cooling fan 104 is positioned toward a middle line of main portion 102 when the cooling fan is inserted within fan slot 108. In this example, panel 306 may be positioned near the middle line when cooling fan 104 is in both the RAF orientation and the NAF orientation. Similarly, panel 304 may be positioned near an outside edge of main portion, such as panel 712 when cooling fan 104 is in both the RAF orientation and the NAF orientation.

In certain examples, panel 302 may be positioned toward panel 710 when cooling fan 104 is in the RAF orientation. Panel 308 may be positioned toward panel 710 when cooling fan 104 is in NAF orientation. Handle 106 may be installed or physically connected to either RAF fan cover 720, as shown in FIG. 7, or installed or physically connected to either NAF fan cover 820 as shown in FIG. 8. In an example, RAF fan cover 720 may connect to cooling fan 104 when in the RAF orientation but not when the cooling fan is in the NAF orientation as will be described with respect to FIGS. 9-12 below.

Figure 9:
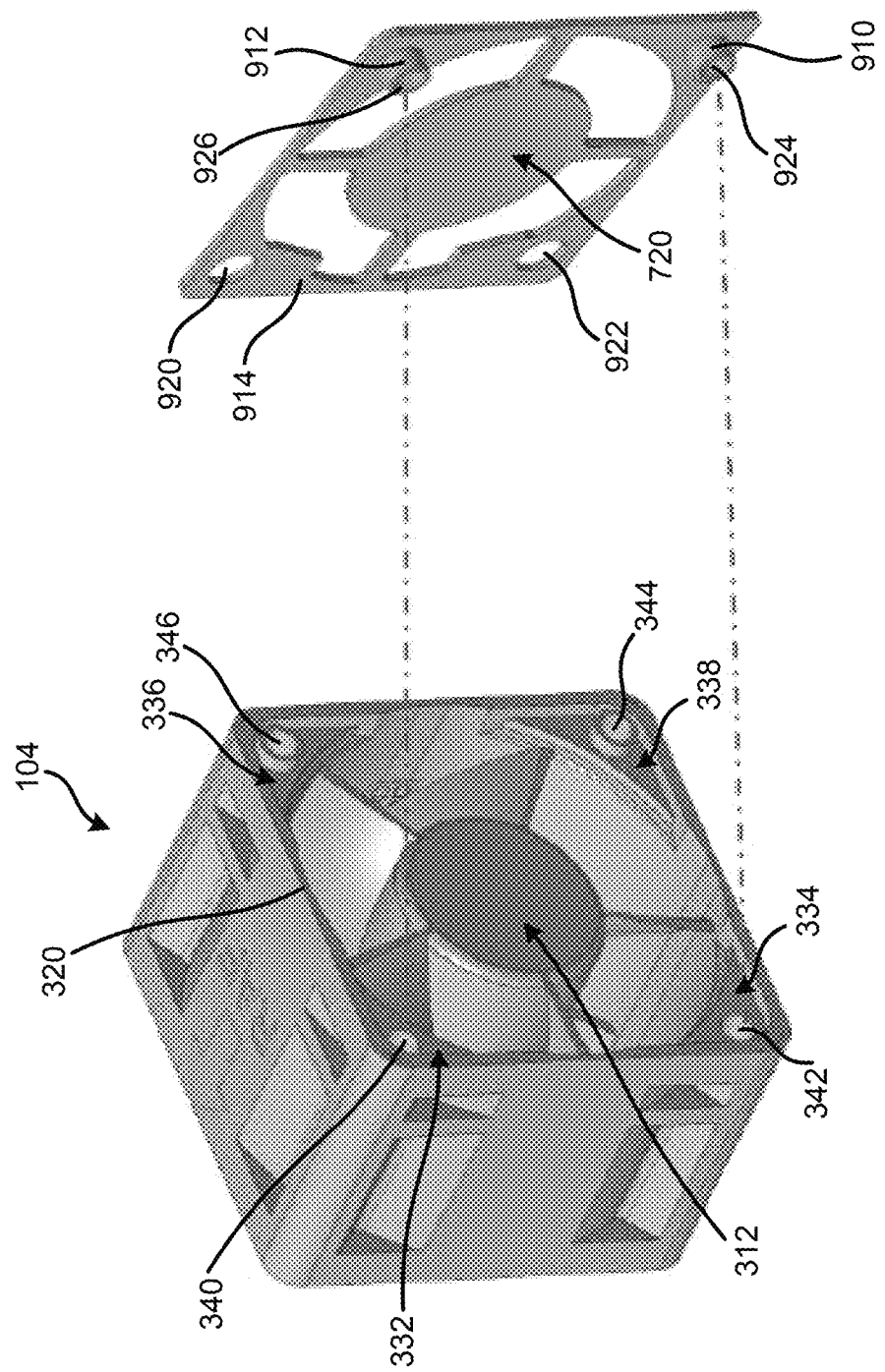
FIG. 9 is a perspective view of a dual direction cooling fan in a reverse airflow orientation and a rear airflow cover according to at least one embodiment of the present disclosure.

FIG. 9 illustrates dual direction cooling fan 104 in the RAF orientation and RAF fan cover 720 according to at least one embodiment of the present disclosure. RAF fan cover 720 includes extension cylinders 910 and 912, and screw holes 920, 922, 924, and 926. Screw hole 924 may extend through extension cylinder 910 and screw hole 926 may extend through extension cylinder 912.

In an example, extension cylinders 910 and 912 are located in corners of RAF fan cover 720 that are along the same edge of the RAF fan cover as illustrated in FIG. 9. Similarly, screw holes 920 and 922 are located in corners of RAF fan cover 720 that are located along the same edge of is RAF fan cover, and this edge is opposite the edge of extension cylinders 910 and 912. Screw hole 920 is located in a corner of RAF fan cover 720 that is diagonal from extension cylinder 910 and screw hole 924. Similarly, screw hole 922 is located in a corner of RAF fan cover 720 that is diagonal from extension cylinder 912 and screw hole 926.

When RAF fan cover 720 is placed on cooling fan 104, screw hole 924 of the RAF fan cover aligns with screw hole 342 of the cooling fan. Similarly, screw hole 926 of RAF fan cover 720 aligns with screw hole 340 of cooling fan 104. Also, screw hole 922 of RAF fan cover 720 aligns with screw hole 344 of cooling fan 104, and screw hole 920 of the RAF fan cover aligns with screw hole 346 of the cooling fan.

Based on support area 332 being located within cooling fan 104 and the opening of screw hole 340 being substantially flush with support area 332, extension cylinder 912 may be placed within the cooling fan so that the opening of screw hole 926 is placed in physical communication with the opening of screw hole 340. In an example, the distance that extension cylinder 912 extends beyond surface 914 may be substantially equal to the distance that support area 332 is from surface 320 of cooling fan 104. In this example, surface 914 may be placed in physical communication with surface 320 when the opening of screw hole 926 is placed in physical communication with the opening of screw hole 340. In another example, the distance that extension cylinder 912 extends beyond surface 914 may be substantially equal to the distance that support area 332 is from surface 320 of cooling fan 104 plus a thickness of a washer. In this example, surface 914 may be placed in physical communication with a surface of a washer and the opposite surface of the washer may be placed in physical communication with surface 320 when the opening of screw hole 926 is placed in physical communication with the opening of screw hole 340.

Based on support area 334 being located within cooling fan 104 and the opening of screw hole 342 being substantially flush with support area 334, extension cylinder 910 may be placed within the cooling fan so that the opening of screw hole 924 is placed in physical communication with the opening of screw hole 342. In an example, the distance that extension cylinder 910 extends beyond surface 914 may be substantially equal to the distance that support area 334 is from surface 320 of cooling fan 104. In this example, surface 914 may be placed in physical communication with surface 320 when the opening of screw hole 924 is placed in physical communication with the opening of screw hole 342. In another example, the distance that extension cylinder 910 extends beyond surface 914 may be substantially equal to the distance that support area 334 is from surface 320 of cooling fan 104 plus a thickness of a washer. In this example, surface 914 may be placed in physical communication with a surface of a washer and the opposite surface of the washer may be placed in physical communication with surface 320 when the opening of screw hole 924 is placed in physical communication with the opening of screw hole 342.

Based on the opening of screw hole 344 being substantially flush with surface 320, surface 914 may be placed in physical communication with surface 320 when the opening of screw hole 922 is placed in physical communication with the opening of screw hole 344. Similarly, based on the opening of screw hole 346 being substantially flush with surface 320, surface 914 may be placed in physical communication with surface 320 when the opening of screw hole 920 is placed in physical communication with the opening of screw hole 346. The configuration of cooling fan 104 along surface 320 may enable surfaces 914 and 320 to be substantially flush with each other when RAF fan cover 902 is secured to cooling fan 104.

In an example, based on the opening of screw hole 344 being substantially flush with surface 320 and a washer being placed around each of extension cylinders 910 and 912, surface 914 may be placed in physical communication with one surface of a washer and another surface of the washer may be placed in physical communication with surface 320. Similarly, based on the opening of screw hole 346 being substantially flush with surface 320 and a washer being placed around each of extension cylinders 910 and 912, surface 914 may be placed in physical communication with one surface of a washer and another surface of the washer may be placed in physical communication with surface 320. The configuration of cooling fan 104 along surface 320 may enable surfaces 914 and 320 to be substantially flush with opposite sides of washers, such as a washer 1020 in FIG. 10, when RAF fan cover 902 is secured to cooling fan 104 as illustrated in FIG. 10.

Figure 10:
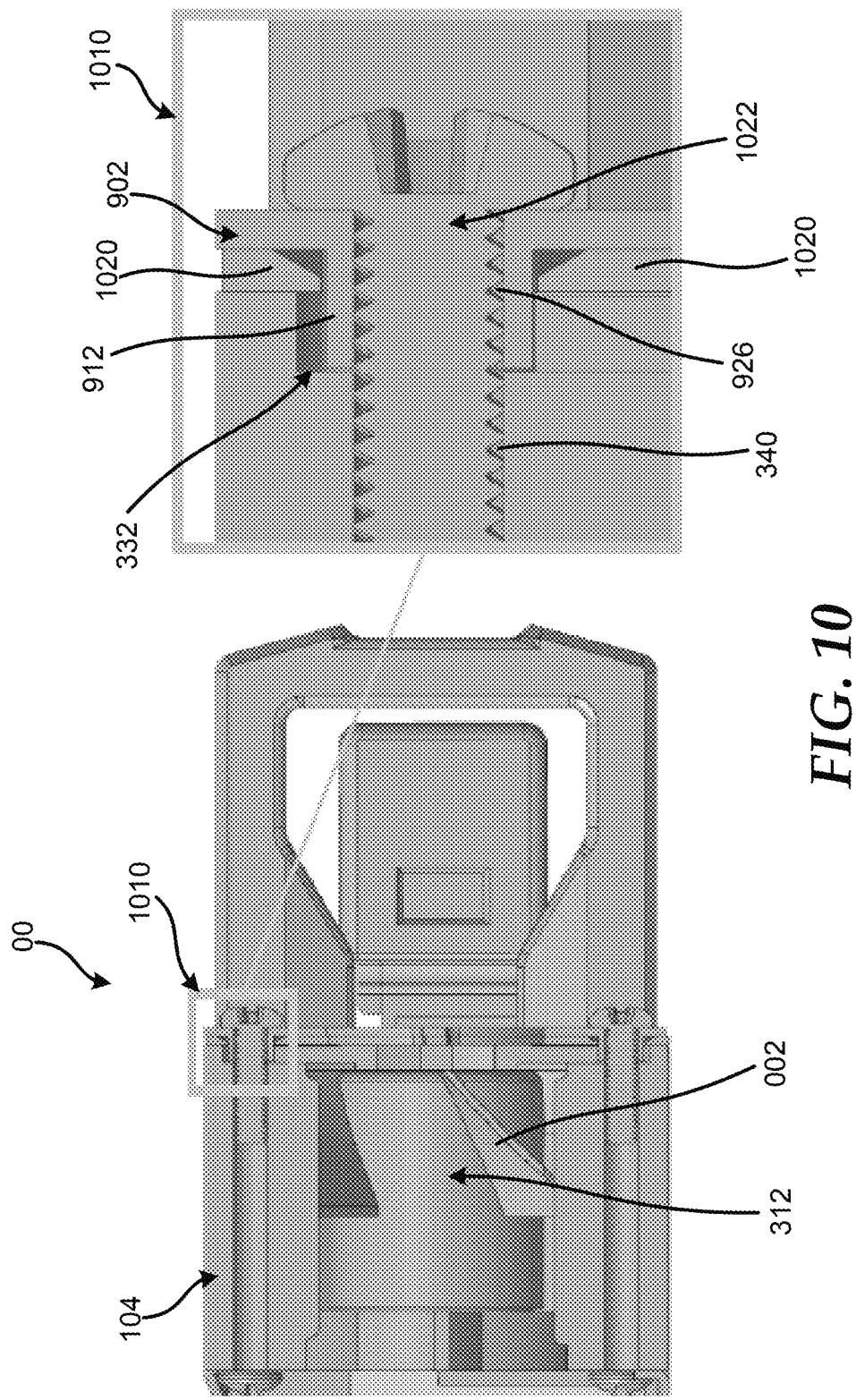
FIG. 10 is a cross sectional view of the dual direction cooling fan in the reverse airflow orientation in physical communication with the rear airflow cover according to at least one embodiment of the present disclosure.

FIG. 10 illustrates a cross section of dual direction cooling fan 104 in the RAF orientation in physical communication with RAF fan cover 720 according to at least one embodiment of the present disclosure. In an example, when cooling fan 104 is in the RAF orientation, propellers 1002 of fan 312 may be located along a rear surface of power supply unit 100. A portion 1010 of power supply unit 100 is shown enlarged to illustrate details of the portion. As illustrated in portion 1010, power supply unit 100 includes washer 1020 and a screw 1022.

In certain examples, washer 1020 may slip over extension cylinder 912 such that a surface of the washer is in physical communication with RAF fan cover 720 and the opposite surface of washer 1020 is in physical communication with cooling fan 104. In an example, screw 1022 may be inserted through screw hole 926 and within screw hole 340. As screw 1022 is tightened, washer 1020 may be compressed until the end of extension cylinder 912 is placed in physical communication with a surface of support area 332. Thus, screw 1022 may securely hold RAF fan cover 720 in physical communication with cooling fan 104.

Figure 11:
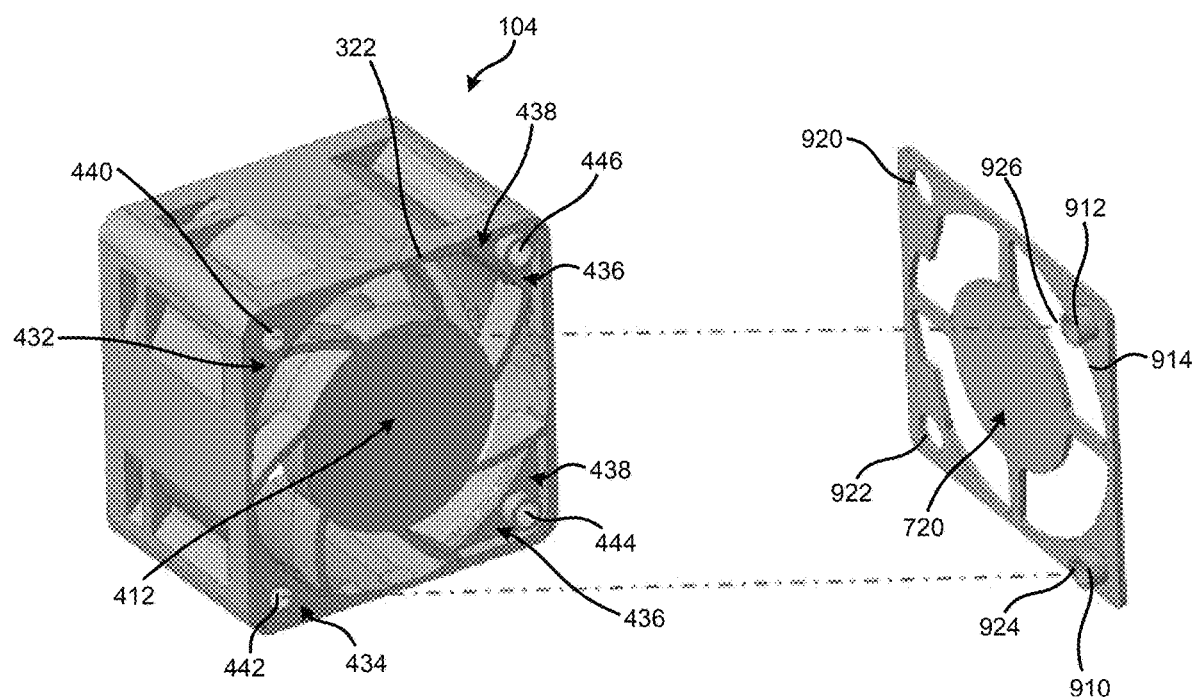
FIG. 11 is a perspective view of the dual direction cooling fan in the normal airflow orientation and the rear airflow cover improperly aligned with the dual direction cooling fan according to at least one embodiment of the present disclosure.

FIG. 11 illustrates dual direction cooling fan 104 in the NAF orientation and RAF fan cover 720 according to at least one embodiment of the present disclosure. RAF fan orientation 720 includes extension cylinders 910 and 912, and screw holes 920, 922, 924, and 926. Screw hole 924 may extend through extension cylinder 910 and screw hole 926 may extend through extension cylinder 912.

In an example, extension cylinders 910 and 912 are located in corners of RAF fan cover 720 that are along the same edge of the RAF fan cover as illustrated in FIG. 11. Similarly, screw holes 920 and 922 are located in corners of RAF fan cover 720 that are located along the same edge of is RAF fan cover, and this edge is opposite the edge of extension cylinders 910 and 912. Screw hole 920 is located in a corner of RAF fan cover 720 that is diagonal from extension cylinder 910 and screw hole 924. Similarly, screw hole 922 is located in a corner of RAF fan cover 720 that is diagonal from extension cylinder 912 and screw hole 926.

When RAF fan cover 720 is placed on cooling fan 104 in the NAF orientation, screw hole 924 of the RAF fan cover aligns with screw hole 442 of the cooling fan. Similarly, screw hole 926 of RAF fan cover 720 aligns with screw hole 440 of cooling fan 104. Also, screw hole 922 of RAF fan cover 720 aligns with screw hole 444 of cooling fan 104, and screw hole 920 of the RAF fan cover aligns with screw hole 446 of the cooling fan.

Based on the opening of screw hole 442 being substantially flush to the surface of support area 434 and based on the length of extension cylinder 910, surface 914 may not be placed in physical communication with surface 322 when the opening of screw hole 924 is placed in physical communication with the opening of screw hole 442 when RAF fan cover 720 is placed in physical communication with cooling fan 104. Based on the opening of screw hole 440 being substantially flush to the surface of support area 432 and based on the length of extension cylinder 912, surface 914 may not be placed in physical communication with surface 322 when the opening of screw hole 926 is placed in physical communication with the opening of screw hole 440 when RAF fan cover 720 is attempted to be secured to cooling fan 104 as illustrated in FIG. 12.

Figure 12:
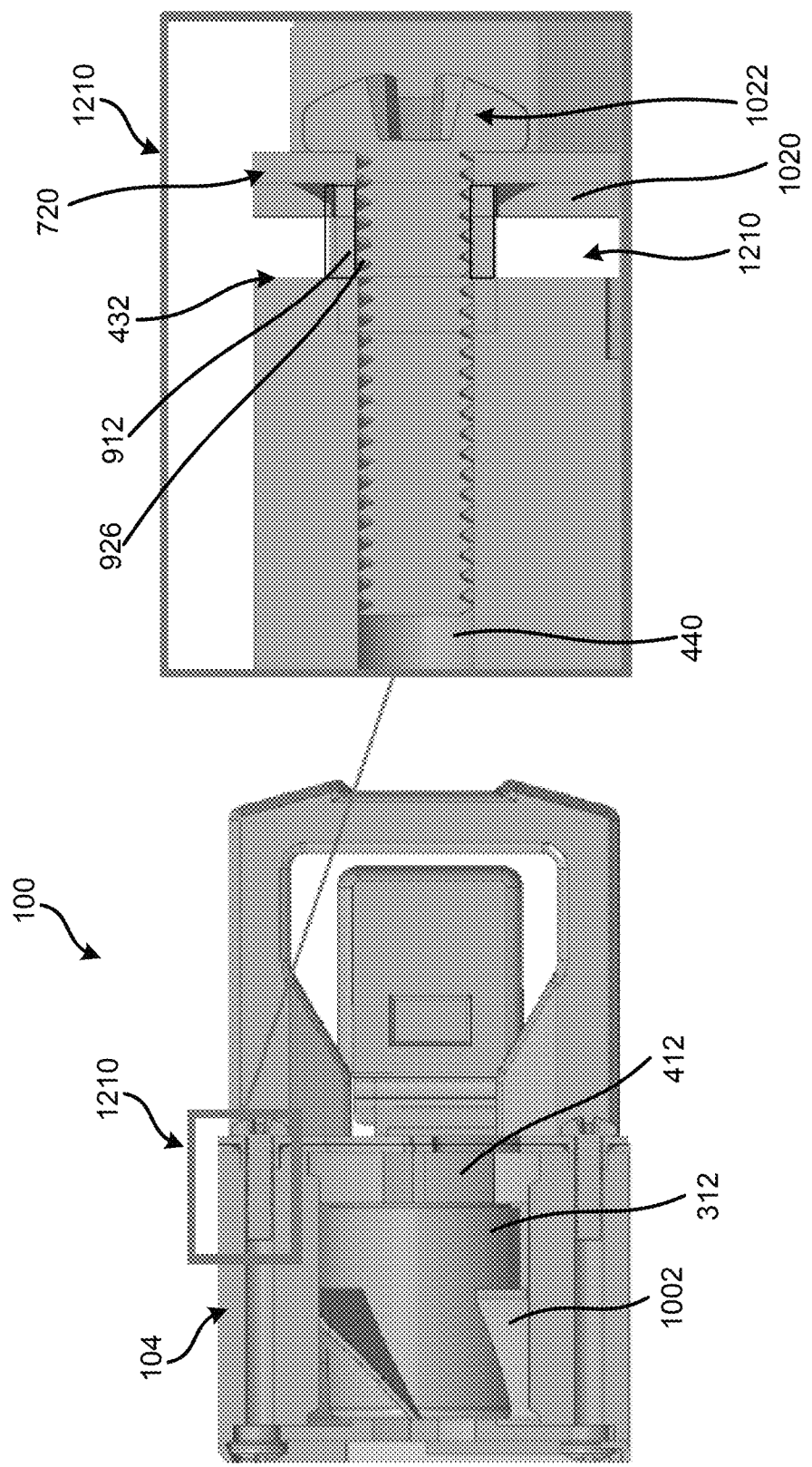
FIG. 12 is a cross sectional view of the dual direction cooling fan in the normal airflow orientation interfering with the rear airflow cover from being properly connected to the dual direction cooling fan according to at least one embodiment of the present disclosure.

FIG. 12 illustrates a cross section of dual direction cooling fan 104 in the NAF orientation in physical communication with RAF fan cover 720 according to at least one embodiment of the present disclosure. In an example, when cooling fan 104 is in the RAF orientation, propellers 1002 of fan 312 may be located within power supply unit 100 and fan cover 412 may be located on the outside of the power supply unit. A portion 1210 of power supply unit 100 is shown enlarged to illustrate details of the portion. As illustrated in portion 1210, power supply unit 100 includes washer 1020 and screw 1022.

In certain examples, washer 1020 may slip over extension cylinder 912. In an example, a gap 1210 may be formed between washer 1020 and the surface of support area 432 when screw 1022 is inserted through screw hole 926 and within screw hole 340. Based on gap 1210 between washer 1020 and the surface of support area 432, RAF fan cover 720 may not properly fit on cooling fan 104 when the cooling fan is in the NAF configuration. Thus, the NAF orientation of cooling fan 104 may not be mislabeled, because RAF fan cover 720 cannot attach to the cooling fan in this orientation.

FIG. 13 shows a generalized embodiment of an information handling system 1300 according to an embodiment of the present disclosure. Information handling system 1300 may be power supply unit 100 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1300 can include processing resources for executing machine-executable code, such as a central processing unit (CPU), a programmable logic array (PLA), an embedded device such as a System-on-a-Chip (SoC), or other control logic hardware. Information handling system 1300 can also include one or more computer-readable medium for storing machine-executable code, such as software or data. Additional components of information handling system 1300 can include one or more storage devices that can store machine-executable code, one or more communications ports for communicating with external devices, and various input and output (I/O) devices, such as a keyboard, a mouse, and a video display. Information handling system 1300 can also include one or more buses operable to transmit information between the various hardware components.

Information handling system 1300 can include devices or modules that embody one or more of the devices or modules described below and operates to perform one or more of the methods described below. Information handling system 1300 includes a processors 1302 and 1304, an input/output (I/O) interface 1310, memories 1320 and 1325, a graphics interface 1330, a basic input and output system/universal extensible firmware interface (BIOS/UEFI) module 1340, a disk controller 1350, a hard disk drive (HDD) 1354, an optical disk drive (ODD) 1356, a disk emulator 1360 connected to an external solid state drive (SSD) 1362, an I/O bridge 1370, one or more add-on resources 1374, a trusted platform module (TPM) 1376, a network interface 1380, a management device 1390, and a power supply 1395. Processors 1302 and 1304, I/O interface 1310, memory 1320, graphics interface 1330, BIOS/UEFI module 1340, disk controller 1350, HDD 1354, ODD 1356, disk emulator 1360, SSD 1362, I/O bridge 1370, add-on resources 1374, TPM 1376, and network interface 1380 operate together to provide a host environment of information handling system 1300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1300.

In the host environment, processor 1302 is connected to I/O interface 1310 via processor interface 1306, and processor 1304 is connected to the I/O interface via processor interface 1308. Memory 1320 is connected to processor 1302 via a memory interface 1322. Memory 1325 is connected to processor 1304 via a memory interface 1327. Graphics interface 1330 is connected to I/O interface 1310 via a graphics interface 1332 and provides a video display output 1336 to a video display 1334. In a particular embodiment, information handling system 1300 includes separate memories that are dedicated to each of processors 1302 and 1304 via separate memory interfaces. An example of memories 1320 and 1330 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1340, disk controller 1350, and I/O bridge 1370 are connected to I/O interface 1310 via an I/O channel 1312. An example of I/O channel 1312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1340 includes BIOS/UEFI code operable to detect resources within information handling system 1300, to provide drivers for the resources, initialize the resources, and access the resources. BIOS/UEFI module 1340 includes code that operates to detect resources within information handling system 1300, to provide drivers for the resources, to initialize the resources, and to access the resources.

Disk controller 1350 includes a disk interface 1352 that connects the disk controller to HDD 1354, to ODD 1356, and to disk emulator 1360. An example of disk interface 1352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1360 permits SSD 1364 to be connected to information handling system 1300 via an external interface 1362. An example of external interface 1362 includes a USB interface, an IEEE 4394 (Firewire) interface, a proprietary interface, or a combination thereof. Alternatively, solid-state drive 1364 can be disposed within information handling system 1300.

I/O bridge 1370 includes a peripheral interface 1372 that connects the I/O bridge to add-on resource 1374, to TPM 1376, and to network interface 1380. Peripheral interface 1372 can be the same type of interface as I/O channel 1312 or can be a different type of interface. As such, I/O bridge 1370 extends the capacity of I/O channel 1312 when peripheral interface 1372 and the I/O channel are of the same type, and the I/O bridge translates information from a format suitable to the I/O channel to a format suitable to the peripheral channel 1372 when they are of a different type. Add-on resource 1374 can include a data storage system, an additional graphics interface, a network interface card (NIC), a sound/video processing card, another add-on resource, or a combination thereof. Add-on resource 1374 can be on a main circuit board, on separate circuit board or add-in card disposed within information handling system 1300, a device that is external to the information handling system, or a combination thereof.

Network interface 1380 represents a NIC disposed within information handling system 1300, on a main circuit board of the information handling system, integrated onto another component such as I/O interface 1310, in another suitable location, or a combination thereof. Network interface device 1380 includes network channels 1382 and 1384 that provide interfaces to devices that are external to information handling system 1300. In a particular embodiment, network channels 1382 and 1384 are of a different type than peripheral channel 1372 and network interface 1380 translates information from a format suitable to the peripheral channel to a format suitable to external devices. An example of network channels 1382 and 1384 includes InfiniBand channels, Fibre Channel channels, Gigabit Ethernet channels, proprietary channel architectures, or a combination thereof. Network channels 1382 and 1384 can be connected to external network resources (not illustrated). The network resource can include another information handling system, a data storage system, another network, a grid management system, another suitable resource, or a combination thereof.

Management device 1390 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1300. In particular, management device 1390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1300, such as system cooling fans and power supplies. Management device 1390 can include a network connection to an external management system, and the management device can communicate with the management system to report status information for information handling system 1300, to receive BIOS/UEFI or system firmware updates, or to perform other task for managing and controlling the operation of information handling system 1300.

Management device 1390 can operate off of a separate power plane from the components of the host environment so that the management device receives power to manage information handling system 1300 when the information handling system is otherwise shut down. An example of management device 1390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1390 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A dual direction cooling fan comprising:
   first and second panels;
   a third panel that extends perpendicularly the between first edges of the first and second panels, wherein the third panel is positioned upward when the dual direction cooling fan is in a reverse airflow orientation;
   a fourth panel that extends perpendicularly to between second edges of the first and second panels, wherein the fourth panel is positioned upward when the dual direction cooling fan is in a normal airflow orientation; and
   connector pins on the first panel, wherein the connector pins include a first row and a second row, wherein a pin in the first row has an opposite voltage as compared to a corresponding pin in the second row, wherein the connector pins receive power and pulse width modulated signals for the dual direction cooling fan.

2. The dual direction cooling fan of claim 1, further comprising:
   a reverse airflow fan cover in physical communication with a rear surface of the dual direction cooling fan, the reverse airflow fan cover includes an extension cylinder protruding from a surface of the reverse airflow fan cover, wherein the extension cylinder is inserted within a portion of the dual direction cooling fan when the dual direction cooling fan is in the reverse airflow orientation, and the extension cylinder is completely outside of the dual direction cooling fan when the dual direction cooling fan is in the normal airflow orientation.

3. The dual direction cooling fan of claim 2, wherein the reverse airflow fan cover includes a reverse airflow direction indicator.

4. The dual direction cooling fan of claim 1, wherein a pin out of the connector pins is a same configuration when the dual direction cooling fan is in both the reverse airflow orientation and the normal airflow orientation.

5. The dual direction cooling fan of claim 1, the third panel includes a reverse airflow direction indicator.

6. The dual direction cooling fan of claim 1, wherein the fourth panel includes a normal airflow direction indicator.

7. A power supply unit comprising:
   a main portion including a cooling fan slot;
   a dual direction cooling fan inserted within the cooling fan slot of the main portion, wherein the dual direction cooling fan is inserted in the cooling fan slot in a reverse airflow orientation or in a normal airflow orientation, the dual direction cooling fan includes:
      a first panel positioned toward a middle line of the main portion when the dual direction cooling fan is inserted within the cooling fan slot;
      a second panel positioned toward an outside edge of the main portion when the dual direction cooling fan is inserted within the cooling fan slot;
      a third panel that extends perpendicularly the between first edges of the first and second panels, wherein the third panel is positioned toward a top panel of the main portion when the dual direction cooling fan is in the reverse airflow orientation;
      a fourth panel that extends perpendicularly between second edges of the first and second panels, wherein the fourth panel is positioned toward the top panel of the main portion when the dual direction cooling fan is in the normal airflow orientation; and
      connector pins on the first panel, wherein the connector pins include a first row and a second row, wherein a pin in the first row has an opposite voltage as compared to a corresponding pin in the second row, wherein the connector pins receive power and pulse width modulated signals for the dual direction cooling fan.

8. The power supply unit of claim 7, further comprising:
   a reverse airflow fan cover in physical communication with the dual direction cooling fan, the reverse airflow fan cover includes an extension cylinder protruding from a surface of the reverse airflow fan cover, wherein the extension cylinder is inserted within a portion of the dual direction cooling fan when the dual direction cooling fan is in the reverse airflow orientation, and the extension cylinder is completely outside of the dual direction cooling fan when the dual direction cooling fan is in the normal airflow orientation.

9. The power supply unit of claim 8, wherein the reverse airflow fan cover includes a reverse airflow direction indicator.

10. The power supply unit of claim 7, wherein a pin out of the connector pins is a same configuration when the dual direction cooling fan is in both the reverse airflow orientation and the normal airflow orientation.

11. The power supply unit of claim 7, further comprising:
a power board and a connector, wherein the connector pins are electrically connected to the connector and the power board when the dual direction cooling fan is inserted within the cooling fan slot, wherein the power board and the connector provide the power and the pulse width modulated signals to the dual direction cooling fan via the connector pins.

12. The power supply unit of claim 7, wherein the dual direction cooling fan moves an airflow from outside the power supply unit when the dual direction cooling fan is in the reverse airflow orientation and moves the airflow from inside the power supply unit when the dual direction cooling fan is in the normal airflow orientation.

13. The power supply unit of claim 7, wherein the third panel includes a reverse airflow direction indicator and the fourth panel includes a normal airflow direction indicator.

14. An information handling system comprising:
- a plurality of components including a processor and memory devices; and
- a power supply to provide power to the processor and the memory devices, the power supply includes:
  - a main portion including a cooling fan slot;
  - a dual direction cooling fan inserted within the cooling fan slot of the main portion, wherein the dual direction cooling fan is inserted in the cooling fan slot in a reverse airflow orientation or in a normal airflow orientation, the dual direction cooling fan includes:
    - a first panel positioned toward a middle line of the main portion when the dual direction cooling fan is inserted within the cooling fan slot;
    - a second panel positioned toward an outside edge of the main portion when the dual direction cooling fan is inserted within the cooling fan slot;
    - a third panel that extends perpendicularly to between first edges of the first and second panels, wherein the third panel is positioned toward a top panel of the main portion when the dual direction cooling fan is in the reverse airflow orientation;
    - a fourth panel that extends perpendicularly to between second edges of the first and second panels, wherein the fourth panel is positioned toward the top panel of the main portion when the dual direction cooling fan is in the normal airflow orientation; and
    - connector pins on the first panel, wherein the connector pins include a first row and a second row, wherein a pin in the first row has an opposite voltage as compared to a corresponding pin in the second row, wherein the connector pins receive power and pulse width modulated signals for the dual direction cooling fan.

15. The information handling system of claim 14, wherein the power supply further comprises:
- a reverse airflow fan cover in physical communication with the dual direction cooling fan, the reverse airflow fan cover includes an extension cylinder protruding from a surface of the reverse airflow fan cover, wherein the extension cylinder is inserted within a portion of the dual direction cooling fan when the dual direction cooling fan is in the reverse airflow orientation, and the extension cylinder is completely outside of the dual direction cooling fan when the dual direction cooling fan is in the normal airflow orientation.

16. The information handling system of claim 14, wherein a pin out of the connector pins is a same configuration when the dual direction cooling fan is in both the reverse airflow orientation and the normal airflow orientation.

17. The information handling system of claim 14, wherein the power supply further comprises: a power board and a connector, wherein the connector pins are electrically connected to the connector and the power board when the dual direction cooling fan is inserted within the cooling fan slot, wherein the power board and connector provide the power and the pulse width modulated signals to the dual direction cooling fan via the connector pins.

\* \* \* \* \*